(12) United States Patent
Goto et al.

(10) Patent No.: US 9,447,286 B2
(45) Date of Patent: Sep. 20, 2016

(54) LOW-FRICTION ZNO COATING AND METHOD FOR PREPARING THE SAME

(71) Applicant: NATIONAL INSTITUTE FOR MATERIALS SCIENCE, Tsukuba-shi, Ibaraki (JP)

(72) Inventors: Masahiro Goto, Tsukuba (JP); Akira Kasahara, Tsukuba (JP); Masahiro Tosa, Tsukuba (JP)

(73) Assignee: NATIONAL INSTITUTE FOR MATERIALS SCIENCE, Tsukuba-shi, Ibaraki (JP)

( * ) Notice: Subject to any disclaimer, the term of this patent is extended or adjusted under 35 U.S.C. 154(b) by 259 days.

(21) Appl. No.: 13/839,025

(22) Filed: Mar. 15, 2013

(65) Prior Publication Data

US 2013/0206038 A1  Aug. 15, 2013

Related U.S. Application Data

(63) Continuation of application No. PCT/JP2011/069994, filed on Sep. 2, 2011.

(30) Foreign Application Priority Data

Sep. 21, 2010 (JP) ................... 2010-210347

(51) Int. Cl.
  *C09D 5/00* (2006.01)
  *C23C 14/08* (2006.01)
(52) U.S. Cl.
  CPC ............... *C09D 5/00* (2013.01); *C23C 14/086* (2013.01)
(58) Field of Classification Search
  None
  See application file for complete search history.

(56) References Cited

U.S. PATENT DOCUMENTS

2004/0038446 A1  2/2004  Takeda et al.

FOREIGN PATENT DOCUMENTS

| CN | 101003894 A | 7/2007 |
|---|---|---|
| JP | 5-295529 A | 11/1993 |
| JP | 3142682 B2 | 3/2001 |
| JP | 2004-6686 A | 1/2004 |
| JP | 2004-052022 A | 2/2004 |
| JP | 2004-290794 A | 10/2004 |

OTHER PUBLICATIONS

Shimai et al, JP 2004-290794, English Translation from PAJ.*
Shimai et al, JP 2004-290794, English Abstract from PAJ.*
Kadota, JP 05-295529, English Translation from PAJ.*

(Continued)

*Primary Examiner* — Colin W Slifka
(74) *Attorney, Agent, or Firm* — Westerman, Hattori, Daniels & Adrian, LLP

(57) ABSTRACT

[Problem to be Solved]
To provide a ZnO coating having low friction not only in a vacuum but in a liquid such as oil.
[Solution]
The low-friction ZnO coating, comprising (002) and (103) planes, and further comprising (100), (101), (102), and (104) planes in lower proportions than those of the (002) and (103) planes, has been prepared by sputtering using a zinc target in a sputter gas environment, wherein the sputter gas comprises an inert gas and oxygen gas, and the oxygen gas ratio is controlled. This coating has a specifically good low friction coefficient due to the piezoelectric effect, and this friction reduction mechanism is maintained even in oil such as n-hexadecane. Thus, this coating has been found to have excellent low-friction properties.

8 Claims, 5 Drawing Sheets

(56) References Cited

OTHER PUBLICATIONS

Kadota, JP 05-295529, English Abstract from PAJ.*
Li-Yu Lin et al., "Micro/nanomechanical properties of aluminum-doped zinc oxide films prepared by radio frequency magnetron sputtering", Elsevier, Science Direct, Surface & Coatings Technology, vol. 201, 2006, pp. 2547-2552 (cited in specification and ISR).
International Search Report for PCT/JP2011/069994, mailing date of Oct. 18, 2011.
Masahiro Goto et al., "Frictional Property of Zinc Oxide Coating Films Observed by Lateral Force Microscopy", Japanese Journal of Applied Physics, vol. 42, Pt. 1, No. 7B, 2003, pp. 4834-4836 (cited in specification).
Masahiro Goto et al., "Reduction in Frictional Force of ZnO Coatings in a Vacuum", Japanese Journal of Applied Physics, vol. 47, No. 12, 2008, pp. 8914-8916 (cited in specification).
S.V. Prasad et al.. "Microstructural evolution in lubricious ZnO films grown by pulsed laser deposition", Elsevier, Thin Solid Films vol. 360, 2000, pp. 107-117 (cited in specification).
J.S. Zabinski et al., "Lubrication using a microstructurally engineered oxide: performance and mechanisms", Tribology Letters, vol. 8, 2000, pp. 103-116 (cited in specification).
Masahiro Goto et al., "Low frictional coating of copper oxide with preferred crystal orientation", Tribology Letters, vol. 17, No. 1, Jul. 2004, pp. 51-54 (cited in specification).
Masahiro Goto et al., "Low frictional properly of copper oxide thin films optimised using a combinatorial sputter coating system", Elsevier, Science Direct, Applied Surface Science, vol. 252, 2006, pp. 2482-2487 (cited in specification).
Masahiro Goto et al., "Frictional properly with preferred crystal orientation of platinum oxide and palladium oxide coatings synthesized by combinatorial sputter coating system", Elsevier, Science Direct, Vacuum, vol. 80, 2006, pp. 740-743 (cited in specification).
National Institute for Materials Science (NIMS), Inorganic Material Database (AtomWork), http://crystdb.nims.go.jp.index_en.html (2 pages); (cited in specification).
Masahiro Goto et al., "Control of frictional force on coating films of boron nitride-copper complex in ultra high vacuum", Elsevier, Thin Solid Films, vol. 405, 2002, pp. 300-303 (cited in specification).
Masahiro Goto et al., "Low frictional coating by cosputtering in combination with excimer laser irradiation for aerospace applications", Journal of Vacuum Science and Technology A, vol. 20, No. 4, 2002, pp. 1458-1461 (cited in specification).
Masahiro Goto et al., "Characteristics of thin films of hexagonal boron nitride mixed with copper controlled b a magnetron co-sputtering deposition technique", Elsevier, Applied Surface Science, vol. 185, 2002, pp. 172-176 (cited in specification).
Holmberg et al., "Coatings Tribology: Properties, Techniques and Applications in Surface Engineering", Tribology Series, vol. 28, pp. 1-5.
Bensmaine, et al., "The effects of the deposition parameters of ZnO thins films on their structural properties", Journal of Electron Devices, vol. 5, 2007, pp. 104-109.
Prasad, et al., "Tribological behavior of nanocrystalline zinc oxide films", Elsevier Science Wear 203-204, 1997, pp. 498-506.
Dang, et al., "Deposition and characterization of sputtered ZnO films", Superlattices and Microstructures, vol. 42, 2007, pp. 89-93.
Ondo-Ndong, et al., "Properties of RF magnetron sputtered zinc oxide thin films", Journal of Crystal Growth, vol. 255, 2003, pp. 130-135.

* cited by examiner

LOW-FRICTION ZNO COATING AND METHOD FOR PREPARING THE SAME

TECHNICAL FIELD

The present invention relates to the reduction of the friction of materials, particularly relates to depositing ZnO on an object whose friction is to be reduced.

BACKGROUND ART

In order to solve the problems of resource depletion and global environment, energy conservation and harvesting of solar energy such as by photovoltaic devices have received much attention. One of the ways of saving energy is to reduce the frictional force of the motion of moving parts used for transportation facilities to thereby save fuel. Many low-friction coatings such as transition-metal dichalcogenides and diamond-like carbon have been developed so far (Non Patent Literature 1). However, the friction coefficients of these solid lubricants usually increase by their reaction with oxygen in air or oil in a high-temperature environment to cause a fatal problem of moving parts. One of the solutions to this problem is using low-friction coatings made from metal oxides. However, the friction coefficient of almost all the metal oxides is large, which therefore makes it difficult to use them as low-friction coatings.

Recently, it has been observed that the friction coefficient in a vacuum of ZnO coatings with crystal preferred orientation is reduced by piezoelectric effect (Non Patent Literatures 2 and 3). The friction coefficient of ZnO coatings was significantly low compared with those previously reported on ZnO by Prasad et al. (Non Patent Literature 4) and Zabinski et al. (Non Patent Literature 5). It is desirable to observe the frictional properties of ZnO coatings with different crystal preferred orientations, in order to understand the low-friction mechanism of the piezoelectric material.

Furthermore, if the frictional force-reduction phenomenon appears not only in a vacuum but in an oil environment, ZnO coatings are expected to be used as a novel low-friction material for energy conservation.

SUMMARY OF INVENTION

Technical Problem

An object of the present invention is to solve the problems of prior art as described above, and to provide a low-friction coating which has much lower friction and achieves low friction even in an environment other than in a vacuum, and a method for producing the same.

Solution to Problem

According to one aspect of the present invention, there is provided a low-friction ZnO coating comprising (002) and (103) planes, and further comprising (100), (101), (102), and (104) planes in lower proportions than those of the (002) and (103) planes. According to another aspect of the present invention, the low-friction ZnO coating is prepared by sputtering using a zinc target in a sputter gas environment, wherein the sputter gas comprises an inert gas and oxygen gas, and the oxygen gas ratio is controlled. This low-friction ZnO coating shows an unprecedented friction phenomenon (the friction coefficient is reduced with an increase in load and an increase in the number of sliding cycles) in a nonpolar molecule liquid, and shows a low friction coefficient.

Specifically, when the oxygen gas ratio is controlled to be higher than 59% and lower than 61%, the low-friction ZnO coating has a lower friction in a vacuum than in the atmosphere; when the oxygen gas ratio is controlled to be 10% or 30 to 100%, the coating has a lower friction in the atmosphere than an uncoated object; and when the oxygen gas ratio is controlled to be 60 to 80%, the friction coefficient is reduced with increases in normal load and number of sliding cycles in the friction measurement with a ball-on-plate tribometer in a nonpolar molecule liquid.

According to a further aspect of the present invention, there is provided a method for preparing a low-friction ZnO coating, comprising: sputtering using a zinc target in a sputter gas environment, wherein the sputter gas comprises an inert gas and oxygen gas, and the oxygen gas ratio is controlled, for example, to be higher than 59% and lower than 61%.

In this method, the sputtering may be radio-frequency magnetron sputtering.

Furthermore, the ZnO coating may be formed on a stainless steel substrate.

Furthermore, the inert gas may be argon gas.

Furthermore, the nonpolar molecule liquid may be hexadecane.

In addition, there is provided a method for utilizing a low-friction ZnO coating, comprising: using the low-friction ZnO coating in a nonpolar molecule liquid containing 0.001 to 1.0% by weight of a polar molecule; and there is also provided a method for utilizing a low-friction ZnO coating, wherein the polar molecule is palmitic acid.

Advantageous Effects of Invention

According to the present invention, a ZnO coating having lower friction than conventional ZnO coatings can be provided, and this novel ZnO coating can significantly reduce the frictional force also in a nonpolar molecule liquid environment.

DESCRIPTION OF EMBODIMENTS

Figure 1:
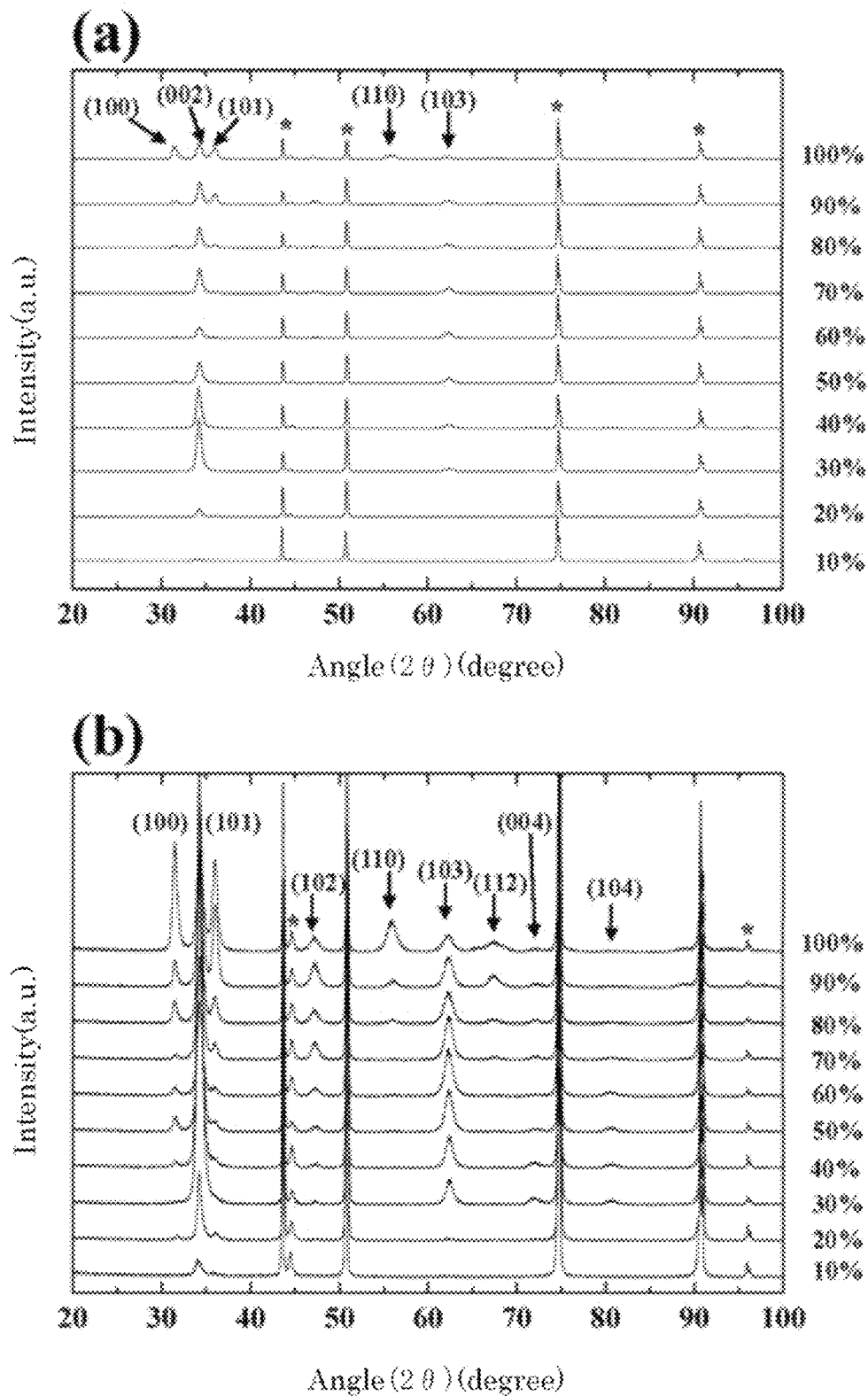
FIG. 1 is a view showing a state that the X-ray diffraction spectra of ZnO coatings on stainless steel samples varies with oxygen gas ratios, wherein peaks for the stainless steel substrate are marked with asterisks (*). The spectra (b) are the spectra in (a) enlarged in the ordinate direction.

In the present invention, ZnO is deposited on a substrate to achieve lower friction of the material. A very large feature thereof is in that the piezoelectric effect which the ZnO material originally has is utilized to thereby allow a load applied from an indenter to generate repulsion, which can reduce frictional force.

The present inventor previously applied for a patent on a similar invention, which was published as Patent Literature 1, but the present invention is different from it. That is, the present inventor has established a technique of systematically varying the crystal preferred orientation of ZnO little by little, and has measured the friction coefficients thereof. As a result, it has been found that only ZnO having a crystal preferred orientation of a specific condition causes the reduction of frictional force by the piezoelectric effect in a vacuum. Furthermore, it has been found that when the material is slid in oil (hexadecane was used in the experiments; generally, in a liquid comprising nonpolar molecules), the reduction of frictional force occurs more significantly than in a vacuum.

Particularly noteworthy is the finding that frictional force is reduced as a load is applied and as the number of sliding cycles is increased, which has resulted in completely reversing conventional common sense. Furthermore, it has been found that when the oil is doped with polar molecules (palmitic acid), the friction coefficient is further reduced. This is probably because the electric dipole of palmitic acid increases Coulomb repulsion.

As described above, the use itself of a material having the piezoelectric effect as a low friction material has been conventionally proposed. However, these conventional proposals are actually not what utilizing piezoelectric effect, but what using a material which can only cause piezoelectric effect as a low friction material. Unlike this, the present invention can truly develop piezoelectric effect and utilize it to achieve lower friction. Crystal structurally, it has now been found for the first time that the effect of the reduction of frictional force by the piezoelectric effect is actually almost or completely not exerted in the ZnO coatings of (002) plane where the development of the piezoelectric effect is the maximum, but a mixed crystal of (002) and (103) and the like is required for exerting such a frictional force-reduction effect.

In Examples of the present invention to be described below, ZnO coatings have been synthesized while controlling crystal preferred orientation using a combinatorial sputter coating system (COSCOS) developed by the present inventor. The frictional properties of the coatings thus prepared were measured in various environments, that is, in a vacuum, in the atmosphere, in oil, and in oil with additive molecules. Note that, needless to say, the present invention is not limited to such specific constitutions and methods, but is defined only by the claims.

EXAMPLES

In Examples of the present invention, COSCOS was used in order to obtain ZnO coatings with controlled crystal preferred orientations. This system is fully automatic, can precisely control various deposition control parameters, can variously change deposition conditions, and can perform various types of coatings at one time. Structurally, many samples are attached to a disc-like sample holder and introduced into a chamber at one time so that a film is formed on each sample under a specified condition. Since this process can be performed without human intervention for a plurality of samples introduced at one time, human errors and production time can be significantly reduced when many samples are prepared by changing the conditions little by little. Since the specific structure, operation, and the like are the subjects already well known to those skilled in the art, description is not given again here, but if necessary, refer to Non Patent Literatures 6 to 8.

ZnO coatings with controlled crystal preferred orientations were synthesized by radio-frequency magnetron sputtering. The sputtering was performed with 100 W power at room temperature on austenitic stainless steel substrates (Type JIS 304) (20×10×1 mm$^3$) with a floating potential during the coating process. The substrate surface roughness (Ry) was approximately 10 nm (TDC Corporation). A sputter target made of Zn (diameter: 50 mm, thickness: 6 mm, 99.999% purity, High Purity Chemical Co.) with argon gas (over 99.999% purity) and oxygen gas (over 99.99% purity) was used for sputter-coating.

The crystal preferred orientation of the ZnO coatings was able to be successfully controlled by changing the partial pressure of the oxygen gas, which was precisely controlled by a high-resolution capacitance manometer. The substrates were ultrasonically cleaned with acetone for 15 min. The presputter time was 15 min and the thickness of the coating was fixed at about 2 μm while being monitored by a crystal thickness monitor. The distance between the target and the sample was fixed at 55 mm. The crystal structure of the coatings was analyzed with an X-ray diffractometer (XRD; Rigaku RINT 2500) using Bragg-Brentano geometry with Cu Kα radiation, and the spectra were assigned using the materials database (NIMS; AtomWork (Non Patent Literature 9)). The hardness of the coatings was analyzed by surface interface cutting analysis system (SAICAS).

The frictional properties of the coatings were measured using a Bowden-Lebenen type ball-on-plate vacuum tribometer (Non Patent Literatures 10 to 12) at atmospheric pressure (in a N$_2$ gas stream environment) and in vacuums of 1×10$^{-5}$ Pa and 7×10$^{-6}$ Pa. A ball probe (diameter: 3 mm) made from austenitic stainless steel (Type JIS 304) with about 40 nm Ry was used in the friction test, in which the operation speed and sliding distance were 0.5 mm/s and 5 mm, respectively. Furthermore, the properties in the atmosphere, in oil (n-hexadecane), and in oil doped with palmitic acid molecules of several different concentrations were also measured using a conventional ball-on-plate sliding friction tester (Shinto Scientific Co., Ltd., HEIDON type HSS2000) by variously changing parameters, that is, normal load and the number of sliding cycles.

The crystal preferred orientation of ZnO coatings was able to be successfully controlled with the COSCOS by changing the partial pressure of the oxygen gas in the sputter gas. The X-ray diffraction spectra of ZnO coatings on stainless steel substrates are shown in FIGS. 1 (a) and (b). The number shown on the axis of ordinates on the right-hand side of these spectra is the partial pressure of the oxygen gas in the sputter gas, expressed as a percentage of the total pressure (that is, the mixing percentage of oxygen gas). In the spectrum of the sample in the case where the oxygen partial pressure is 10%, nine peaks of ZnO, that is, (100), (002), (101), (102), (110), (103), (112), (004), and (104) appeared with the peaks from the stainless steel substrate. The peak intensity of each plane gradually varied as the mixing percentage of oxygen gas was changed.

Figure 2:
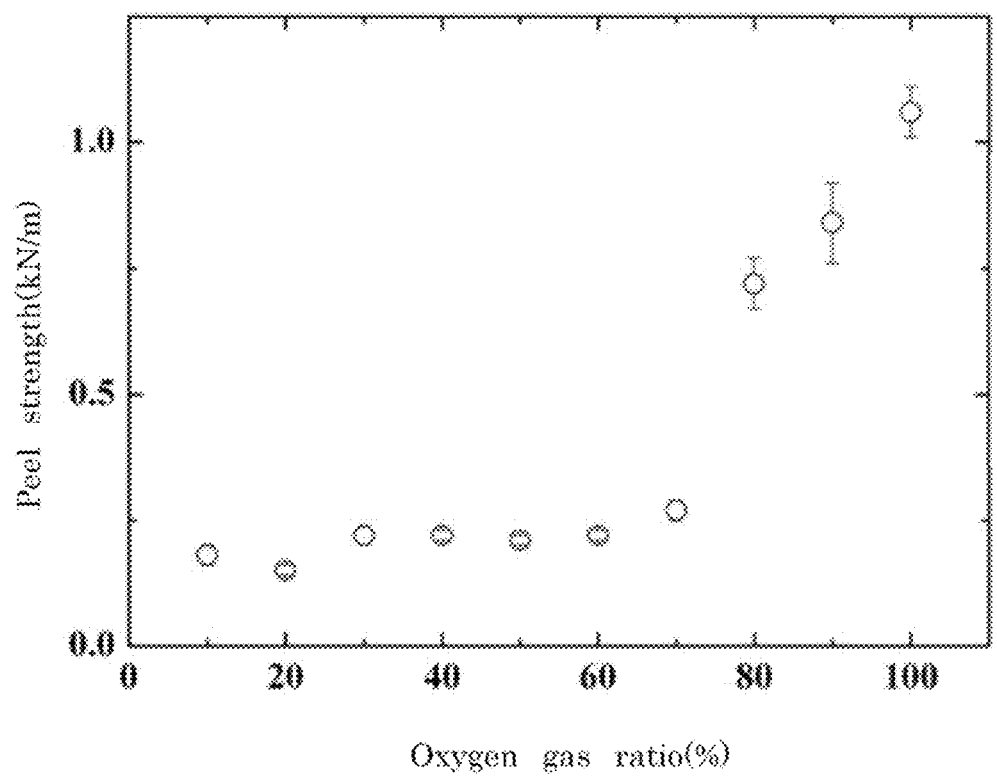
FIG. 2 is a view showing a state that the peel strength of ZnO coatings varies with oxygen gas ratios.

FIG. 2 shows the peel strength between ZnO and a substrate. Observation was performed three times, and the average values were plotted in the graph. The error bars show the maximum error for each data point. In the range where the mixing percentage of oxygen gas is 10 to 70%, the peel strength slightly increased with increasing of the ratio, but in the range where the mixing percentage of oxygen gas is 70 to 100%, the peel strength drastically increased. This may be related to the amount and energy of the oxygen ions injected into the sample during the coating process.

Figure 3:
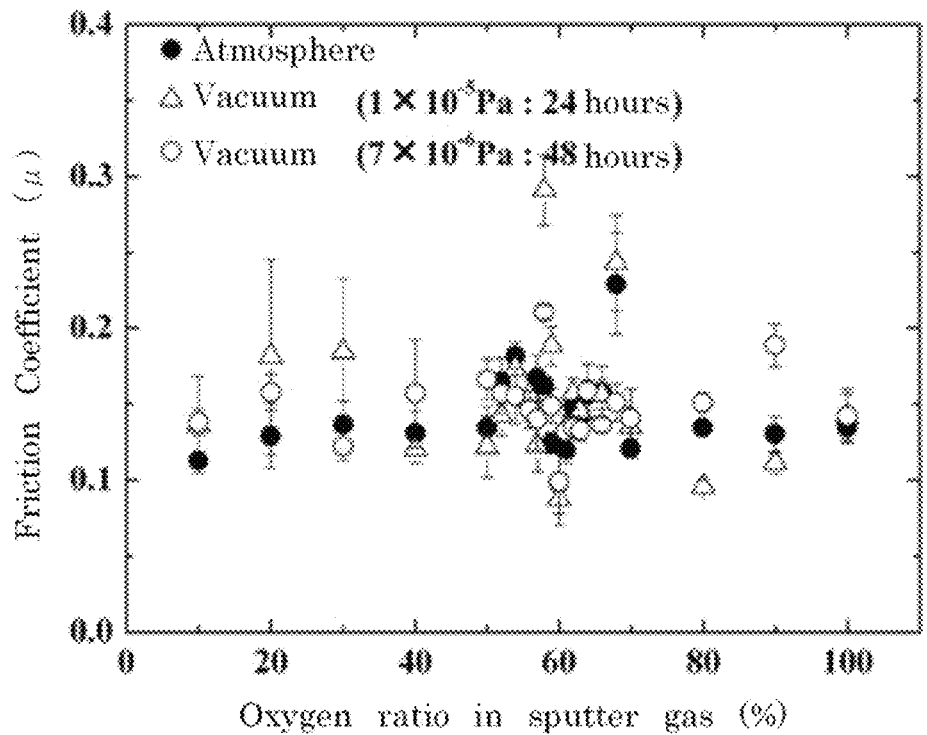
FIG. 3 is a graph showing the dependence of friction coefficient on oxygen gas ratio measured with a stainless steel ball probe. In the graph, ● shows the results measured in the atmosphere; Δ shows the results measured in a vacuum ($1 \times 10^{-5}$ Pa: vacuum pumping was performed for 24 hours); and ○ shows the results measured in a vacuum ($7 \times 10^{-6}$ Pa: vacuum pumping was performed for 48 hours). The graph (b) is the graph (a) enlarged at the central part of abscissa (the region where the ratio of oxygen gas is 50% to 70%).
Figure 3:
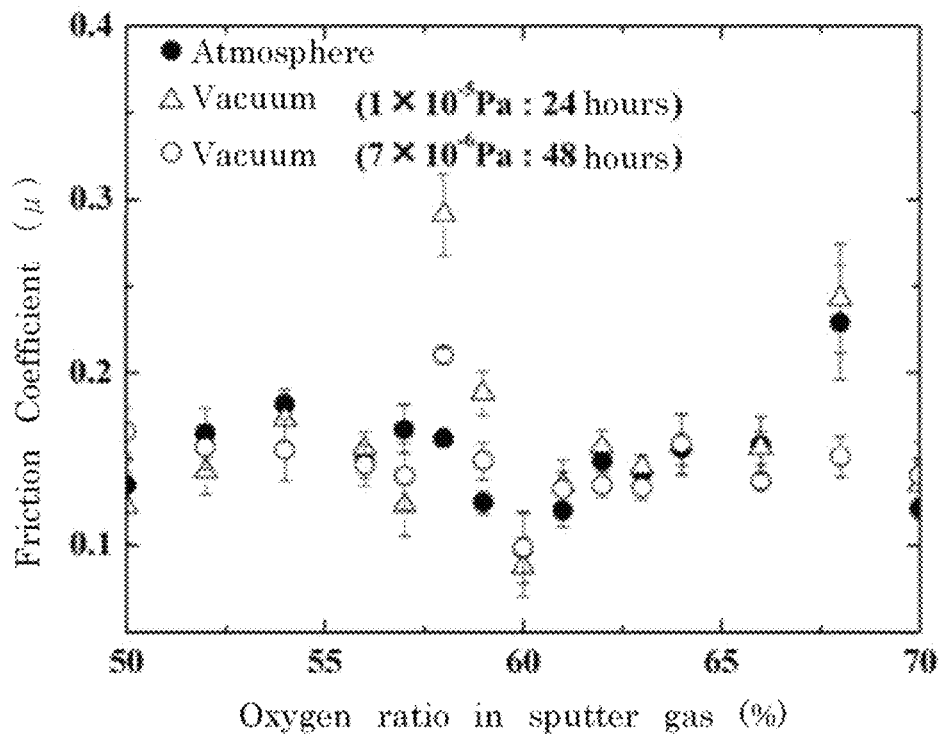

FIGS. 3 (a) and (b) show a state that the friction coefficient varies depending on the oxygen gas ratio (mixing percentage) in the sputter gas, showing the data at atmospheric pressure (under the condition of $N_2$ gas stream) and in an ultrahigh vacuum (UHV) (about $1 \times 10^{-5}$ Pa (24-hour vacuum pumping) and about $7 \times 10^{-6}$ Pa (48-hour vacuum pumping)). The friction measurements were performed ten times for each sample. The coefficient values remained stable after three times of sliding. Then, each value of the friction coefficient in the graph plots was calculated as the average of the eight subsequent measurements. The error bars show a standard deviation. The friction coefficient significantly varied with the change of load and environmental conditions. For the samples of an oxygen ratio of 10 to 50%, the friction coefficients in UHV were significantly higher than the values in the atmosphere. This is completely ordinary behavior in the case of conventional materials. However, the friction coefficients in UHV for the samples of an oxygen ratio in the range of 50 to 100% were smaller than or almost the same as the values in the atmosphere. In the atmosphere and in vacuum conditions ($1 \times 10^{-5}$ Pa and $7 \times 10^{-6}$ Pa) at a normal load of 0.2 N, the friction coefficients ($\mu$=0.098, 0.088, and 0.099) have been achieved on the ZnO coating samples of 60% oxygen ratio. This has revealed that the friction coefficient hardly varies with environmental conditions for the samples prepared under these sputtering conditions.

Figure 4:
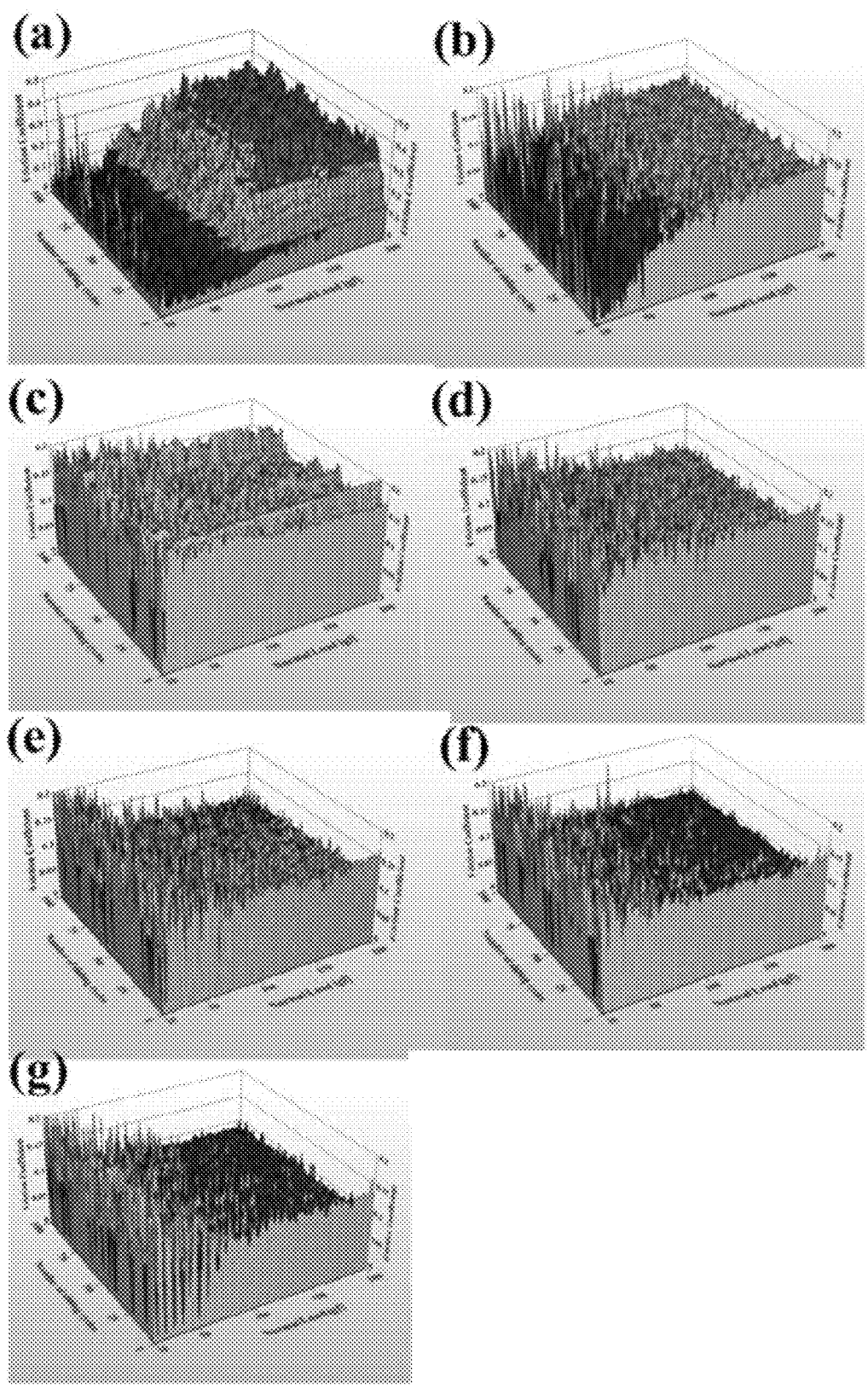
FIG. 4 illustrates 3D friction coefficient graphs of ZnO coatings with an oxygen gas concentration of 60% scratched by a stainless steel ball as a function of normal load and the number of sliding cycles, wherein the axis extending from the corner on this side to the left back represents the number of sliding cycles; the axis extending from the corner on this side to the right hand represents normal load (gf); and the axis of ordinates represents the friction coefficient. Here, the graph (a) shows the results of measurement of an uncoated substrate in the atmosphere; the graph (b) shows the results of measurement of ZnO coating in the atmosphere; the graph (c) shows the results of measurement of an uncoated substrate in n-hexadecane; the graph (d) shows the results of measurement of ZnO coating in n-hexadecane; the graph (e) shows the results of measurement of ZnO coating in n-hexadecane containing 0.001% by weight of palmitic acid; the graph (f) shows the results of measurement of ZnO coating in n-hexadecane containing 0.1% by weight of palmitic acid; and the graph (g) shows the results of measurement of ZnO coating in n-hexadecane containing 1% by weight of palmitic acid.

FIG. 4 shows the results of measurements of the friction coefficients of the stainless steel substrates and the ZnO coating samples of 60% oxygen ratio when a stainless steel ball was slid with changing normal loads and the number of sliding cycles in the atmosphere, in n-hexadecane, and in n-hexadecane with palmitic acid (0.001, 0.1, 1% by weight). FIGS. 4 (a) and (b) show 3D friction coefficient graphs of the substrate and the ZnO coating at atmospheric pressure in flowing nitrogen gas, respectively. In FIG. 4 (a), the friction coefficient sharply increased above a normal load of about 100 gf. On the other hand, the friction coefficient of the ZnO coating maintained a value as low as 0.125 in all the regions of the graph. This has revealed that this coating has acted as a low friction material in the atmosphere. FIGS. 4 (c) and (d) show the 3D graphs of the friction coefficient of the substrate and the ZnO coating in n-hexadecane solution, respectively. In FIG. 4 (c), the friction coefficient was almost constant at 0.15. However, in FIG. 4 (d), the friction coefficient had the minimum value at the maximum load and the maximum number of sliding cycles (that is, at the back side corner in the graph). This is a very interesting property which appears only when the ZnO coating is in an oil (n-hexadecane) environment, and this phenomenon may have been caused by the piezoelectric effect, same as in a vacuum condition which was previously reported in Non Patent Literature 1. FIG. 4 (e) to (g) show the friction coefficient of the ZnO coating in n-hexadecane containing 0.001% by weight, 0.1% by weight, and 1% by weight of palmitic acid, respectively. The friction coefficient was further reduced with an increase in palmitic acid concentration. Furthermore, the minimum point of the friction coefficient in each graph was the same as in the case of the 3D graph in the case of only oil.

Figure 5:
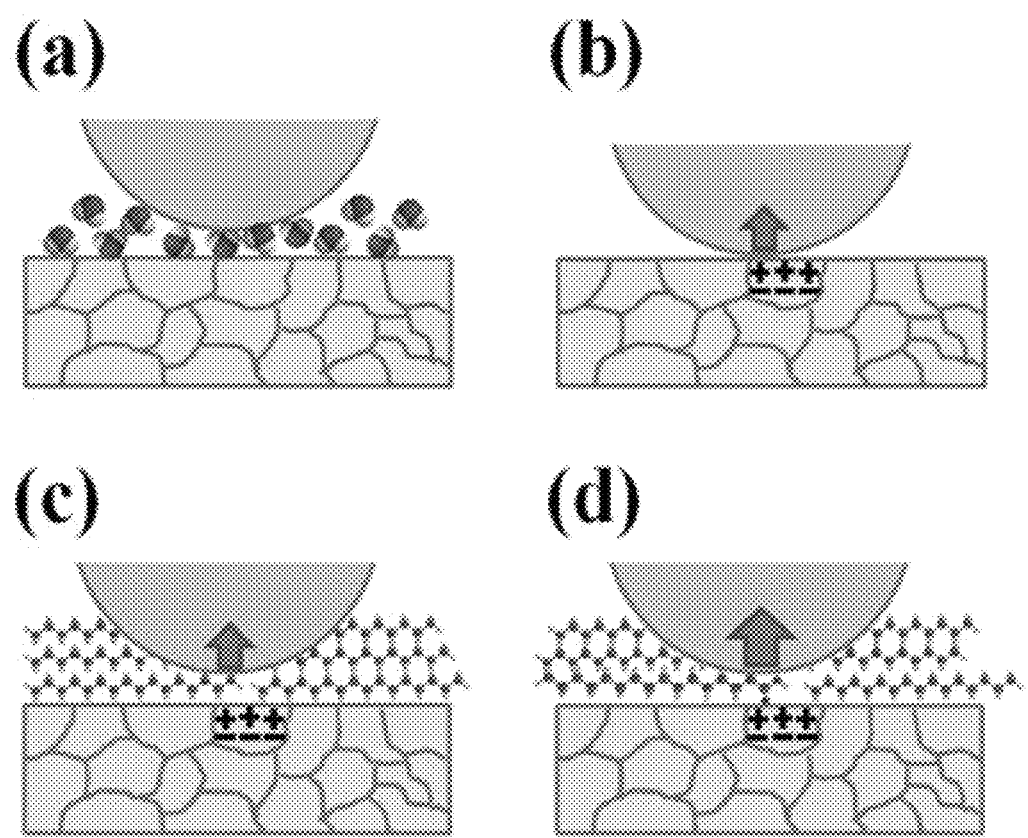
FIG. 5 is the conceptual diagram of friction process models accompanied by the piezoelectric effect, wherein the models (a), (b), (c), and (d) show models in the atmosphere, in a vacuum, in a hexadecane solution, and in hexadecane containing palmitic acid molecules, respectively.

FIGS. 5 (a), (b), (c), and (d) show the conceptual diagram of the models of sliding in consideration of the piezoelectric effect in the atmosphere, in a vacuum, in hexadecane, and in hexadecane containing palmitic acid molecules, respectively. Only the ZnO coating sample of 60% oxygen gas ratio mainly comprising (002) and (103) planes and also comprising a small amount of (100), (101), (102), and (104) planes showed the frictional force-reduction phenomenon by the piezoelectric effect as shown in FIG. 5 (b) in a vacuum. On the other hand, the ZnO coating of 30% oxygen gas ratio mainly comprises (002) crystal orientation plane, but this coating did not show the reduction of the friction coefficient in a vacuum. A suitable combination percentage of a plurality of crystal planes such as (002), (103), (100), (101), (102), and (104) of the ZnO samples of 60% oxygen gas ratio was required for the development of explicit reduction of the friction coefficient. This prediction model is suggested in Non Patent Literatures 2 and 3 by the present inventor. An electric dipole is induced on the surface of the ZnOZnO coating, which is a piezoelectric material, by pushing a spherical probe. Furthermore, electric repulsion is generated between the sphere and the coating surface. However, the friction coefficient in the atmosphere significantly increased with increases in normal load and number of sliding cycles. At atmospheric pressure, a layer of adsorbed water is present on the surface of the ZnO coating, and the piezoelectric effect at atmospheric pressure may be canceled because water has a strong electric dipole.

FIGS. 4 (c) and (d) show the 3D graphs of the friction coefficient in a hexadecane solution in the case of the substrates only and in the case of the ZnO coating samples of 60% oxygen gas ratio, respectively. In the case of the substrates, the friction coefficient was almost constant over all the regions. However, in the case of the ZnO coatings, the friction coefficient had the minimum value at the maximum load and the maximum number of sliding cycles. The model corresponding to this case is shown in FIG. 5 (c). Hexadecane is a typical nonpolar molecule by its linear structure. Therefore, in contrast to the case of the water molecules shown in FIG. 5 (a), the Coulomb repulsion by the piezoelectric effect did not disappear in the hexadecane solution, that is, in a nonpolar molecule liquid. Furthermore, FIG. 5 (d) shows a sliding model in the hexadecane solution to which a small amount of palmitic acid molecules is added. The palmitic acid molecules increased the repulsion between the sphere and the coating by their electric dipole moment.

The palmitic acid molecules each have a long structure (the right end of the palmitic acid molecules is directly under the upward arrow in FIG. 5 (d), and this right end part is polarized); thus, it is difficult to mutually align these molecules so that the electric field may be immediately canceled. After all, this molecular dipole may act so that the repulsion may be increased in the hexadecane solution. Probably, the ZnO coatings may be used as a low friction coating in oil.

INDUSTRIAL APPLICABILITY

As described above, the crystal preferred orientation of the ZnO coating which is a typical piezoelectric material was controlled on a stainless steel substrate using radio-frequency magnetron sputtering by the COSCOS method. The frictional properties were measured at atmospheric pressure, in a vacuum, in a hexadecane solution, and in a hexadecane solution containing palmitic acid molecules using a pin-on-plate tribometer. The friction coefficient was significantly reduced in a vacuum, in a hexadecane solution, and in a hexadecane solution containing palmitic acid molecules by the piezoelectric effect. This can pave the way for a new field in which piezo material coatings with crystal preferred orientation are used as a low-friction coating for the moving parts of transportation facilities such as an airplane, a ship, and a motor vehicle, for the saving of fuel based on the piezoelectric effect. This is because when the piezoelectric effect is used, the frictional force of such parts can be reduced without requiring any energy from the outside under an oil or vacuum condition. Moreover, since an oxide can be used as such a coating material, it can also be used in an environment such as high temperature and high humidity.

CITATION LIST

Patent Literature

Patent Literature 1: Japanese Patent Laid-Open No. 2004-52022

Non Patent Literature

Non Patent Literature 1: K. Holmberg and A. Matthews: Coating Tribology. (1994) Elsevier Science.
Non Patent Literature 2: M. Goto, A. Kasahara, Y. Konishi, T. Oishi, M. Tosa, and K. Yoshihara: Jpn. J. Appl. Phys. 42 (2003) 4834.
Non Patent Literature 3: M. Goto, A. Kasahara and M. Tosa, Jpn. J. Appl. Phys., 47 (2008) 8914-8916.
Non Patent Literature 4: S. V. Prasad, S. D. Walck, and J. S. Zabinski: Thin Solid Films 360 (2000) 107.
Non Patent Literature 5: J. S. Zabinski, J. H. Sanders, J. Nainaparampil, and S. V. Prasad: Tribol. Lett. 8 (2000) 103.
Non Patent Literature 6: M. Goto, A. Kasahara, T. Oishi and M. Tosa, Tribology Letters, 17, (1) 51-54, (2004).
Non Patent Literature 7: M. Goto, A. Kasahara, and M. Tosa: Appl. Surf. Sci. 252 (2006) 2482.
Non Patent Literature 8: M. Goto, A. Kasahara and M. Tosa, Vacuum, 80, (7) 740-743, (2006).
Non Patent Literature 9: Atom Work: Inorganic Material Database;
http://crystdb.nims.go.jp/index_en.html.
Non Patent Literature 10: M. Goto, A. Kasahara, M. Tosa, and K. Yoshihara: Thin Solid Films 405 (2002) 300.
Non Patent Literature 11: M. Goto, A. Kasahara, M. Tosa, J. Hobley, K. Yoshihara, H. Fukumura, J. Vac. Sci. Technol., A 20 (4) (2002) 1458.
Non Patent Literature 12: M. Goto, A. Kasahara, M. Tosa, T. Kimura, and K. Yoshihara: Appl. Surf. Sci. 185 (2002) 172.

The invention claimed is:

1. A ZnO coating comprising
(002) and (103) planes, and
(100), (101), (102), and (104) planes,
wherein the (100), (101), (102) and (104) planes each have a lower proportion than the proportion of each of the (002) and (103) planes, and
wherein a friction coefficient of the ZnO coating in a nonpolar molecule solution decrease as a normal load and number of sliding cycles increase.

2. The ZnO coating according to claim 1, wherein the coating is prepared by sputtering using a zinc target in a sputter gas environment, wherein the sputter gas comprises an inert gas and oxygen gas, and an oxygen gas ratio is determined so that the frication coefficient in a nonpolar molecule solution may decrease as normal load and number of sliding cycles increase.

3. The ZnO coating according to claim 1, wherein, in a nonpolar molecule liquid, the coating has a lower friction coefficient than an uncoated object.

4. The ZnO coating according to claim 1, wherein the nonpolar molecule solution further contains 0.001 to 1.0% by weight of a polar molecule.

5. The ZnO coating according to claim 4, wherein the polar molecule is palmitic acid.

6. A method for reducing friction of a surface comprising a step of applying over the surface the low-friction ZnO coating according to claim 1.

7. The method for reducing friction of a surface according to claim 6, wherein the friction of the surface is a friction in a nonpolar molecule liquid containing 0.001 to 1.0% by weight of a polar molecule.

8. The method for reducing friction of a surface according to claim 7, wherein the polar molecule is palmitic acid.

* * * * *